(12) United States Patent
Reznicek et al.

(10) Patent No.: US 9,812,575 B1
(45) Date of Patent: Nov. 7, 2017

(54) CONTACT FORMATION FOR STACKED FINFETS

(71) Applicant: GLOBALFOUNDRIES INC., Grand Cayman (KY)

(72) Inventors: Alexander Reznicek, Troy, NY (US); Pouya Hashemi, White Plains, NY (US); Kangguo Cheng, Schenectady, NY (US); Dominic J. Schepis, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/266,092

(22) Filed: Sep. 15, 2016

(51) Int. Cl.
| | | |
|---|---|---|
| *H01L 29/78* | (2006.01) |
| *H01L 29/165* | (2006.01) |
| *H01L 23/528* | (2006.01) |
| *H01L 29/66* | (2006.01) |
| *H01L 27/088* | (2006.01) |
| *H01L 21/8234* | (2006.01) |
| *H01L 27/092* | (2006.01) |

(52) U.S. Cl.
CPC .... *H01L 29/785* (2013.01); *H01L 21/823431* (2013.01); *H01L 21/823475* (2013.01); *H01L 23/5283* (2013.01); *H01L 27/0886* (2013.01); *H01L 27/0924* (2013.01); *H01L 29/165* (2013.01); *H01L 29/66795* (2013.01)

(58) Field of Classification Search
CPC .......... H01L 29/785; H01L 21/823431; H01L 21/823475; H01L 23/5283; H01L 27/0924; H01L 27/0886; H01L 29/165; H01L 29/66795
See application file for complete search history.

(56) References Cited

U.S. PATENT DOCUMENTS

| 9,356,027 B1* | 5/2016 | Cheng | H01L 27/0924 |
| 2005/0184316 A1* | 8/2005 | Kim | H01L 29/66795 257/213 |
| 2016/0322462 A1* | 11/2016 | Chou | H01L 21/30604 |

* cited by examiner

*Primary Examiner* — Fei Fei Yeung Lopez
(74) *Attorney, Agent, or Firm* — Scully, Scott, Murphy & Presser PC

(57) ABSTRACT

FinFET structures include a stacked fin architecture formed on a semiconductor substrate. The stacked fin architecture includes a template semiconductor layer disposed on the substrate beneath the semiconductor fins that is used as an etch stop during fin formation and to form a laterally-extending epitaxial layer for contacting the bottom tier of fins within the stack.

17 Claims, 10 Drawing Sheets

CONTACT FORMATION FOR STACKED FINFETS

BACKGROUND

The present application relates generally to semiconductor devices and their methods of manufacture, and more specifically to stacked fin field effect transistor (FinFET) devices and the formation of contact structures for such devices.

Fully-depleted devices such as fin field effect transistors are candidates to enable scaling of next generation gate lengths to 14 nm and below. Three-dimensional (3D) monolithic integration where transistors are stacked on top of each other is a promising approach for continued transistor density scaling. In a 3D stacked fin CMOS device, a self-aligned stack of fins can be formed where the top tier and bottom tier fins are respectively used for devices with opposite conductivity types (i.e., p-type and n-type). Such an approach enables a reduced footprint by stacking one type of transistor (e.g., a p-type FinFET) on top of a complementary type of device (e.g., an n-type FinFET), and also permits the incorporation of different channel materials for the two types of devices. In a stacked fin CMOS device, the p-type FinFET and the n-type FinFET typically share a common gate electrode.

Because of the stacked geometry, it is challenging to make electrical contact to both the top and the bottom tier fins to enable independent control thereof. In view of the foregoing, it would be advantageous to develop methods and associated structures that enable stacked FinFET architectures, which beneficially enable further device scaling.

SUMMARY

A method of forming a semiconductor structure includes forming a plurality of stacked semiconductor fins on a substrate, and forming a plurality of epitaxial raised active regions on the source and drain regions of the fins. A template layer is provided on the substrate beneath the semiconductor layers used to define the fins. The template layer can have a different composition than the semiconductor layer used for the bottom tier of fins in order to provide etch selectivity and an etch stop during fin formation. Furthermore, the template layer can extend laterally to pattern the growth of a bottom tier epitaxial structure that is displaced laterally from a top tier epitaxial structure enabling robust contact to both top and bottom active regions.

In accordance with embodiments of the present application, a semiconductor structure includes a fin stack disposed on a substrate. The fin stack includes a first semiconductor fin, a dielectric fin atop the first semiconductor fin, and a second semiconductor fin atop the dielectric fin. A template semiconductor layer is disposed beneath the fin stack. A composition of the template semiconductor layer is different than a composition of the first semiconductor fin.

In accordance with further embodiments, a method of forming a semiconductor structure comprises forming a template semiconductor layer on a substrate and forming a plurality of stacked semiconductor fins on the template semiconductor layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
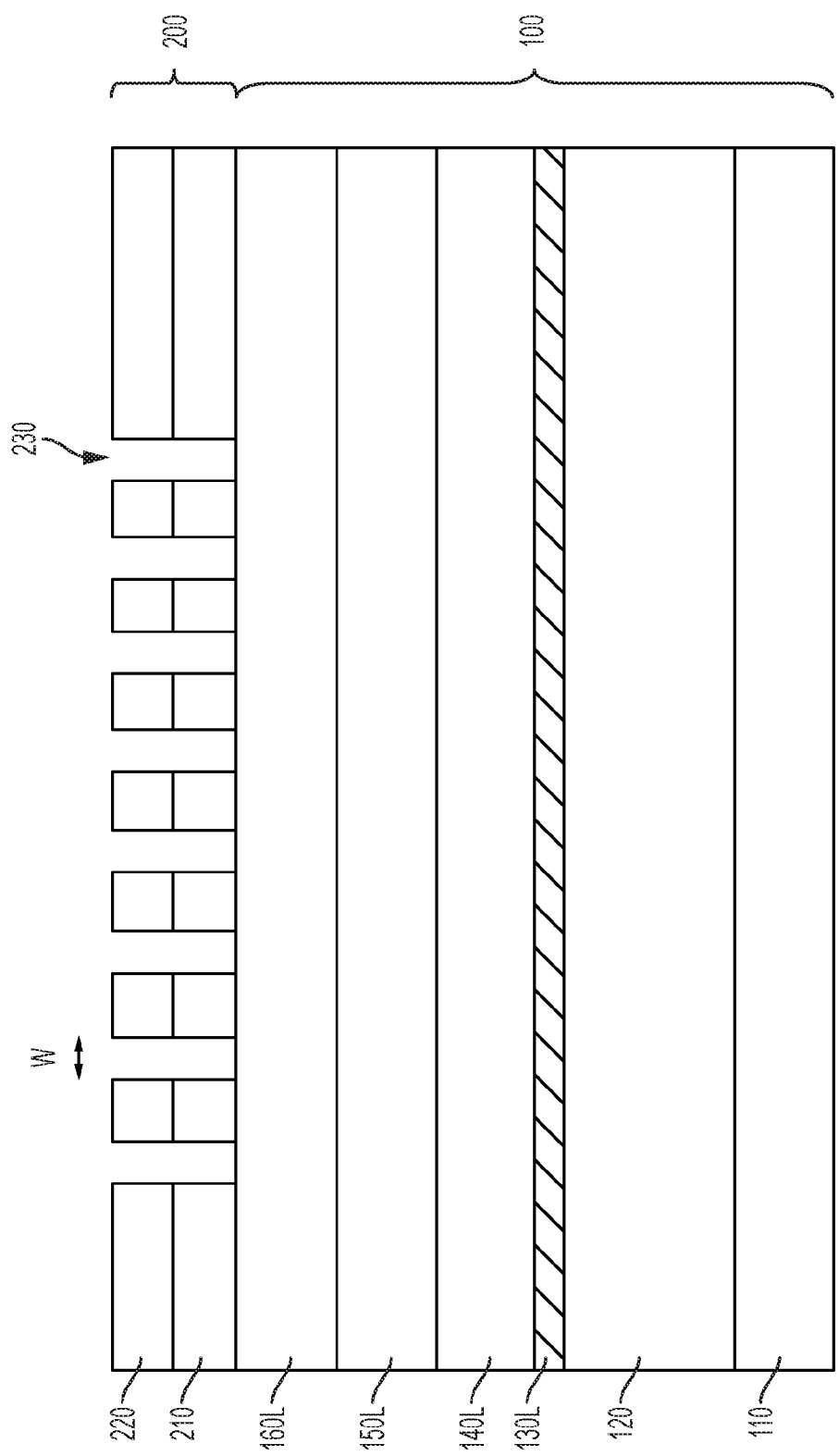
FIG. 1 is a cross-sectional view of a multi-layer semiconductor substrate architecture used to fabricate a stacked fin semiconductor device according to various embodiments.

Reference will now be made in greater detail to various embodiments of the subject matter of the present application, some embodiments of which are illustrated in the accompanying drawings. The same reference numerals will be used throughout the drawings to refer to the same or similar parts.

Embodiments of the application relate generally to semiconductor devices and their methods of manufacture, and more particularly to the manufacture of fin field effect transistors (FinFETs). Disclosed are FinFET structures that include a stacked fin architecture formed on a semiconductor substrate. The stacked fin architecture includes a template semiconductor layer that is used to form a laterally extending epitaxial layer for contacting a bottom tier of fins within the stack. A method of forming a stacked FinFET device and the resulting structure is described herein with reference to FIGS. 1-8.

As seen with reference to FIG. 1, a semiconductor substrate 100 according to exemplary embodiments includes, from bottom to top, a handle substrate 110, a first dielectric layer 120, a template semiconductor layer 130L, a first semiconductor layer 140L, a second dielectric layer 150L, and a second semiconductor layer 160L. The first semiconductor layer 140L and the second semiconductor layer 160L are used to form semiconductor fins for a stacked fin CMOS device, for example. The first dielectric layer 120L serves as an insulator between the handle substrate 110 and the template semiconductor layer 130L, and the second dielectric layer 150L serves as an insulator between the first semiconductor layer 140L and the second semiconductor layer 160L.

Handle substrate 110 provides mechanical support during handling and processing of the substrate 100 and may include a semiconductor material such as silicon (Si) or a silicon-containing material. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multilayers thereof. As used herein, the term "single crystal" denotes a crystalline solid, in which the crystal lattice of the entire sample is substantially continuous and substantially unbroken to the edges of the sample with substantially no grain boundaries.

Handle substrate 110 is not limited to silicon-containing materials, however, as the handle substrate 110 may comprise other semiconductor materials, including Ge and compound semiconductors such as GaAs, InAs and other like semiconductors.

The first dielectric layer 120 may include a dielectric material such as, for example, silicon dioxide, silicon nitride, silicon oxynitride, boron nitride, a low-k material, or a combination thereof. Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. As used herein, a low-k material has a dielectric constant less than that of silicon dioxide. The thickness of the first dielectric layer 120 can be from 50 nm to 300 nm, although lesser and greater thicknesses can be used.

The template semiconductor layer 130L may include a semiconducting material such as, for example, Si, SiC, SiGe, SiGeC, GaAs, InAs, InP as well as other III/V or II/VI compound semiconductors. The template semiconductor layer 130L may be composed of a semiconductor material that is the same as, or different from, that of the handle substrate 110. In various embodiments, the template semiconductor layer 130L is composed of a single crystalline semiconductor material, such as, for example, single crystalline silicon germanium (SiGe). According to various embodiments, a silicon germanium (SiGe) template semiconductor layer 130L can include 20 to 50 atomic percent germanium, e.g., 20, 30, 40 or 50 at. %, including ranges between any of the foregoing values. The thickness of the template semiconductor layer 130L can be from 5 nm to 50 nm, e.g., 5, 10, 20 or 50 nm, including ranges between any of the foregoing values, although lesser and greater thicknesses can be used.

The first semiconductor layer 140L may include a semiconducting material such as, for example, Si, SiC, SiGe, SiGeC, GaAs, InAs, InP as well as other Ill/V or II/VI compound semiconductors. The first semiconductor layer 140L may be composed of a semiconductor material that is different than that of the template semiconductor layer 130L. Thus, as explained in further detail below, the template semiconductor layer 130L provides an etch stop during formation of the fins. In various embodiments, the first semiconductor layer 140L is composed of a single crystalline semiconductor material, such as, for example, single crystalline silicon. The thickness of the first semiconductor layer 140L can be from 5 nm to 150 nm, e.g., 50, 10, 20, 50, 100 or 150 nm, including ranges between any of the foregoing values, although lesser and greater thicknesses can be used.

The first semiconductor layer 140L may be doped with p-type dopants or n-type dopants. Examples of p-type dopants for a silicon-containing semiconductor material include, but are not limited to, boron, aluminum, gallium and indium. Examples of n-type dopants for a silicon-containing semiconductor material, include but are not limited to, antimony, arsenic and phosphorous.

The second dielectric layer 150L may include a dielectric material such as, for example, silicon dioxide, silicon nitride, silicon oxynitride, boron nitride, a low-k material, or a combination thereof. The second dielectric layer 150L may be comprised of a dielectric material the same as, or different from, that of the first dielectric layer 120. In one embodiment, each of the first dielectric layer 120 and the second dielectric layer 150L comprise silicon dioxide. The thickness of the second dielectric layer 150L can be from about 20 nm to about 150 nm, e.g., 20, 50, 100 or 150 nm, including ranges between any of the foregoing values, although lesser and greater thicknesses can be used.

First and second dielectric layers 120, 150L may comprise the buried oxide (BOX) layer of a semiconductor-on-insulator (SOI) substrate, or an oxidized layer of a bulk silicon substrate.

The second semiconductor layer 160L is comprised of any semiconducting material that may be the same as, or different from, that of the first semiconductor layer 140L. Thus, the second semiconductor layer 160L may include, for example, Si, SiC, SiGe, SiGeC, GaAs, InAs, InP as well as other III/V or II/VI compound semiconductors.

In one embodiment and when the first semiconductor layer 140L includes Si, which is suited for n-type FETs, the second semiconductor layer 160L may include SiGe, which is suited for p-type FETs, or vice versa.

The second semiconductor layer 160L may be doped with dopants to have a conductivity opposite to that of the first semiconductor layer 140L. The thickness of the second semiconductor layer 160L can be from about 5 nm to about 150 nm, e.g., 50, 10, 20, 50, 100 or 150 nm, including ranges between any of the foregoing values, although lesser and greater thicknesses can be used.

According to various embodiments, the second semiconductor layer 160L may have a crystallographic orientation that is the same as, or different from, that of the first semiconductor layer 140L. The second semiconductor layer 160L having a crystal orientation different from that of the first semiconductor layer 140L allows for the fabrication of FinFETs on crystallographic orientations that provide optimal performance for each type of device (i.e., p-type FinFETs and n-type FinFETs). For example, n-type FinFETs have improved performance when fabricated on a (100) crystallographic surface, while p-type FinFETs have improved performance when fabricated on a (110) crystallographic surface.

The substrate 100 may be formed using processes for providing a semiconductor-on-insulator (SOI) wafer known in the art. For example, a layer transfer process that includes wafer bonding may be used. In the layer transfer process, two or more semiconductor wafers are bonded together. The two or more wafers used in fabricating the substrate 100 may include SOI wafers. For example, one wafer including the handle substrate 110, the first dielectric layer 120, and the template semiconductor layer 130L can be bonded to another wafer that includes the first semiconductor layer 140L, the second dielectric layer 150L, and the second semiconductor layer 160L. At least one of the wafers can be subjected to hydrogen implantation to provide a $H_2$ implanted region, which can be used to cleave a portion of at least one of the wafers during bonding. Alternatively, substrate 100 can be formed using a Separation by IMplanted OXygen (SIMOX) technique, as is well known in the art.

The substrate 100 may have dimensions as typically used in the art. For instance, the substrate may be a semiconductor wafer. Example wafer diameters include, but are not limited to, 50, 100, 150, 200, 300 and 450 mm. The total substrate thickness may range from 250 microns to 1500 microns, though in particular embodiments the substrate thickness is in the range of 725 to 775 microns, which corresponds to thickness dimensions commonly used in silicon CMOS processing.

Figure 2:
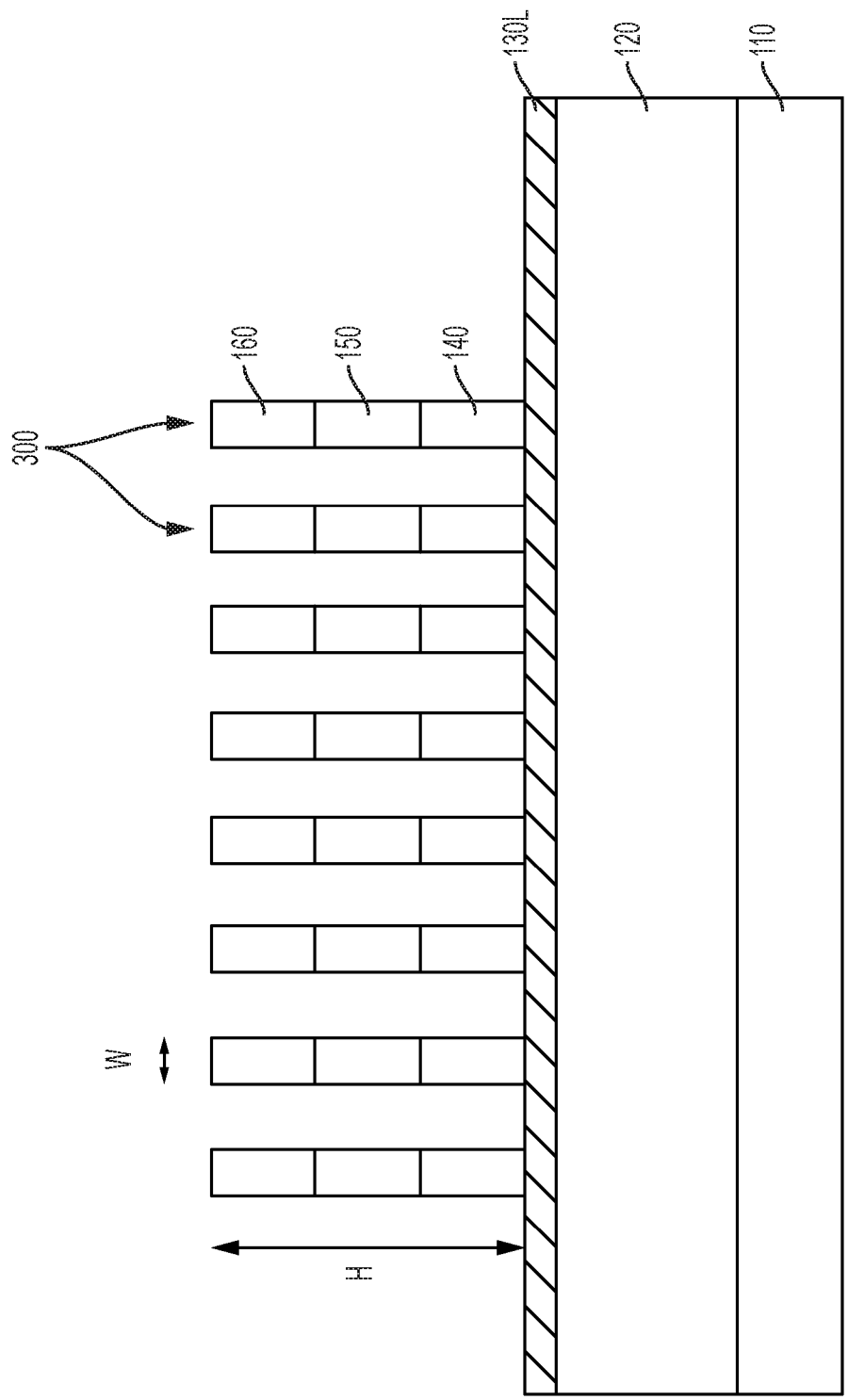
FIG. 2 shows the formation of a plurality of stacked fins on a semiconductor substrate.

Referring to FIG. 2, fin stacks 300 may be patterned and etched from the substrate. Each of the fin stacks 300 includes, from bottom to top, a first semiconductor fin 140, a dielectric fin 150 and a second semiconductor fin 160. As used herein, a "fin" refers to a contiguous semiconductor material and includes a pair of vertical sidewalls that are parallel to each other. As used herein, a surface is "vertical" if there exists a vertical plane from which the surface does not deviate by more than three times the root mean square roughness of the surface. Each of a plurality of fins stacks 300 extends along a lengthwise direction. As used herein, a "lengthwise direction" is a horizontal direction along with an object extends the most. A "widthwise direction" is a horizontal direction that is perpendicular to the lengthwise direction.

In certain embodiments, the as-formed fin stacks 300 are free standing, i.e., supported only by the substrate 100. Each stacked fin has a height (H) that may range from 30 nm to 200 nm and a width (W) that may range from 4 nm to 30 nm. Other heights and widths that are less than or greater than the ranges mentioned can also be used. In structures comprising plural fins, each fin may be spaced apart from its nearest neighbor by a pitch (i.e., repeat distance) of 20 nm to 100 nm, e.g., 20, 50, 75 or 100 nm, including ranges between any of the foregoing values. Such plural fins are typically oriented parallel to each other.

The fin stacks (140, 150, 160) may be formed by lithography and etching. Referring again to FIG. 1, in various embodiments, a hard mask 200 is disposed over, e.g., directly over the second semiconductor layer 160L to protect the underlying semiconductor layers during subsequent patterning processing. The hard mask 200 may be formed using any conventional deposition technique, such as, for example, chemical vapor deposition (CVD), plasma-enhanced CVD (PECVD), metal organic chemical vapor deposition (MOCVD), atomic layer deposition (ALD), evaporation, reactive sputtering, chemical solution deposition, spin-on deposition, thermal oxidation, or other like processes. For instance, the hard mask 200 can be formed by a low pressure chemical vapor deposition (LPCVD) process using silane ($SiH_4$) or a halogenated silane precursor.

In certain embodiments, the hard mask 200 includes a first layer 210 and a second layer 220 overlying the first layer 210. The first layer 210 may be composed of an oxide, a nitride, or an oxynitride and may promote adhesion of the hard mask 200 to the SOI layer 106, and the second layer 220 may be composed of an oxide, a nitride, or an oxynitride, for example. In various embodiments, the first layer 210 comprises a pad oxide layer such as a silicon dioxide layer and the second layer 220 comprises a pad nitride layer such as a silicon nitride layer. The hard mask 200 can have a thickness ranging from 40 nm to 200 nm.

The hard mask 200 may be patterned and etched to form one or more preliminary openings 230 in the hard mask to expose a portion of the second semiconductor layer 160L. Openings 230 may have a width (W). The patterning process may comprise photolithography, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. In the instant embodiment, this provides a patterned layer of photoresist atop a portion of the hard mask 200. As shown in FIGS. 1 and 2, the pattern provided by the patterned photoresist material is thereafter transferred into the underlying material layers utilizing at least one pattern transfer etching process.

The pattern transfer etching process may be an isotropic etch or an anisotropic etch. Illustrative examples of suitable dry etching processes that may be used to form fin stacks 300 include reactive ion etching (RIE), ion beam etching, plasma etching or laser ablation. In other embodiments, a wet chemical etchant can be used. In still further embodiments, a combination of dry etching and wet etching can be used. An RIE process for forming the fin stacks may comprise $CF_4$ or $CHF_3$, for example. As seen in FIG. 2, the pattern transfer etching may stop on the template semiconductor layer 130L, or a portion of the template semiconductor layer 130L may be removed during formation of the fin stacks 300.

Thus, the etching process transfers the pattern from the patterned photoresist layer to the hard mask 200, and then to the stack of the second semiconductor layer 160L, the second dielectric layer 150L, and the first semiconductor layer 140L, using the template semiconductor layer 130L as an etch stop layer. The etching process may use plural etch chemistries and/or plural etch steps to successively etch the fin-defining stack of layers (160L, 150L, 140L). Each remaining portion of the first semiconductor layer 140L constitutes a first semiconductor fin 140, each remaining portion of the second dielectric layer 150L constitutes a dielectric fin 150, and each remaining portion of the second semiconductor layer 160L constitutes a second semiconductor fin 160. After forming the fins stacks (140, 150, 160), the patterned photoresist layer can be removed utilizing a conventional resist stripping process such as, for example, ashing.

In another embodiment, the patterning process used to form fin stacks (140, 150, 160) may include a sidewall image transfer (SIT) process. The SIT process includes forming a mandrel material layer (not shown) atop the material or material layers (i.e., crystalline silicon) that is to be patterned. The mandrel material layer can include any material (semiconductor, dielectric or conductive) that can be selectively removed from the structure during a subsequently performed etching process. For instance, the mandrel material layer may be composed of amorphous silicon or polysilicon. In another embodiment, the mandrel material layer may be composed of a metal such as, for example, Al, W, or Cu. The mandrel material layer can be formed, for example, by chemical vapor deposition or plasma enhanced chemical vapor deposition. Following deposition of the mandrel material layer, the mandrel material layer can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the pattern provided by the dielectric spacers is transferred into the underlying material or material layers. The pattern transfer may be achieved by at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In various embodiments, each of a plurality of semiconductor fin stacks 300 extends along a lengthwise direction (L) with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction.

The handle substrate 110, first dielectric layer 120, and template semiconductor layer 130L collectively function as a substrate on which the plurality of semiconductor fin stacks 300 are disposed. In various embodiments, the substantially rectangular vertical cross-sectional shape adjoins a horizontal interface with a top surface of the template semiconductor layer 130L. A shown in FIG. 2, each fin stack 300 has a bottom surface that is disposed directly on a top surface of the template semiconductor layer 130L such that each fin stack and the template semiconductor layer cooperate to form an inverted "T" shape. Plural fins may have identical or substantially identical dimensions, i.e., height and/or width. As used herein, substantially identical dimensions vary by less than 10%, e.g., less than 5%, 2% or 1%.

Figure 3:
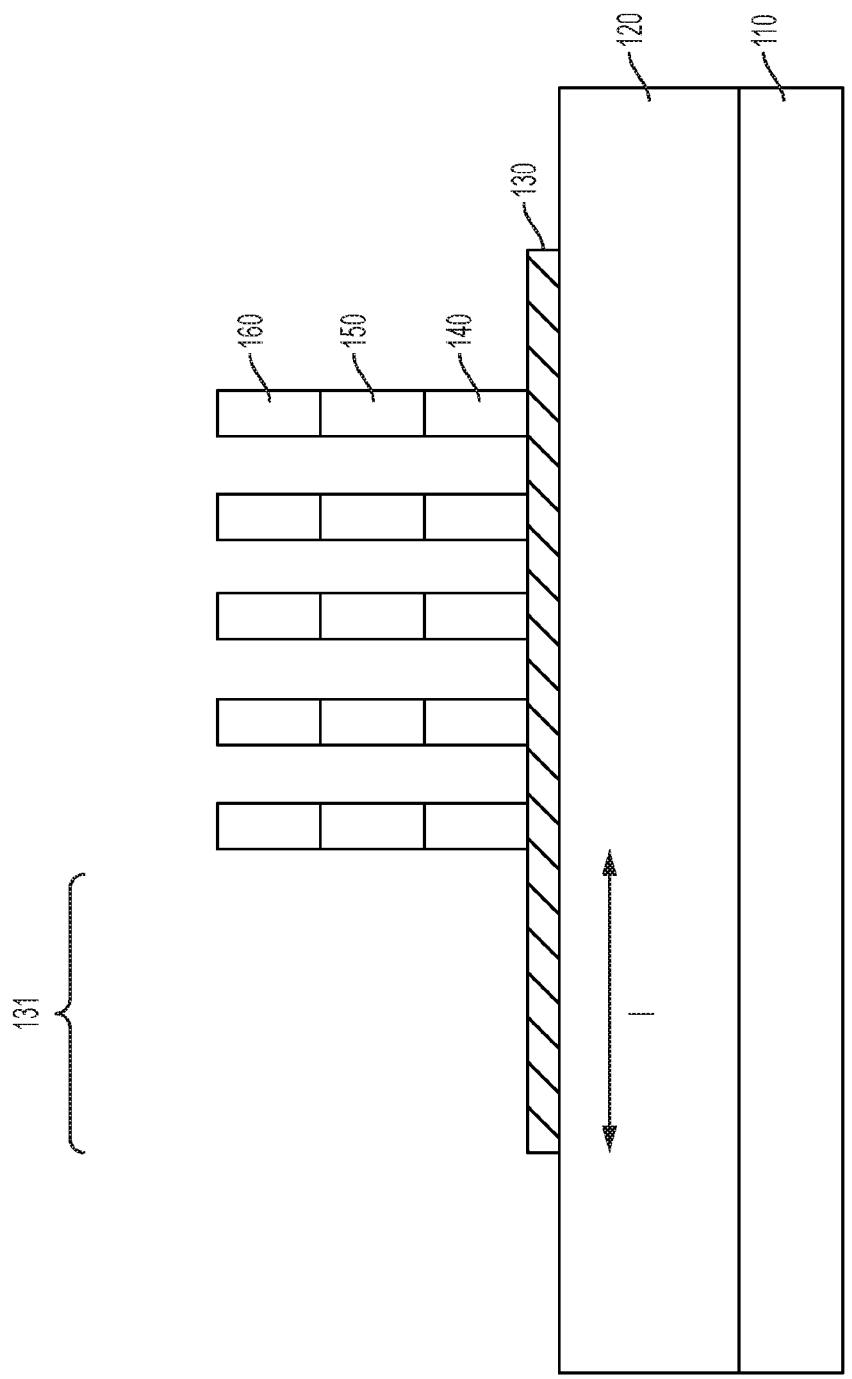
FIG. 3 shows removal of selected fin stacks and the patterning of a template layer located beneath the bottom tier of fins.

Referring to FIG. 3, a first portion of the fin stacks located within region 131 can be removed using a blocking mask (not shown) that covers a second portion of the fin stacks outside of region 131. One or more etch steps can be used to remove selected fin stacks 300, including reactive ion etch (RIE), ion beam etching, plasma etching or laser ablation. In various embodiments, a wet chemical etch process can be used. In still further embodiments, a combination of dry etching and wet etching can be used.

Template semiconductor layer 130L can be patterned and etched using a wet and/or dry etch to form a patterned semiconductor template 130 that laterally surrounds the remaining fin stacks 300. In embodiments where the template semiconductor layer 130L comprises silicon germanium, an example etching solution for selectively etching the template semiconductor layer 130L may comprise acetic acid, hydrogen peroxide and hydrofluoric acid. As shown, a portion of the patterned semiconductor template 130 extends laterally in a direction orthogonal to a lengthwise direction of the fins into region 131.

In some embodiments of the present application, the hard mask 200 that remains atop the fin stacks (140, 150, 160) can be removed. The removal of the remaining portion of the hard mask may be achieved by performing a selective etch or by utilizing a planarization process such as chemical mechanical planarization (CMP). In some embodiments, a portion of the hard mask 200 can remain atop each of the fin stacks (140, 150, 160).

Figure 4A:
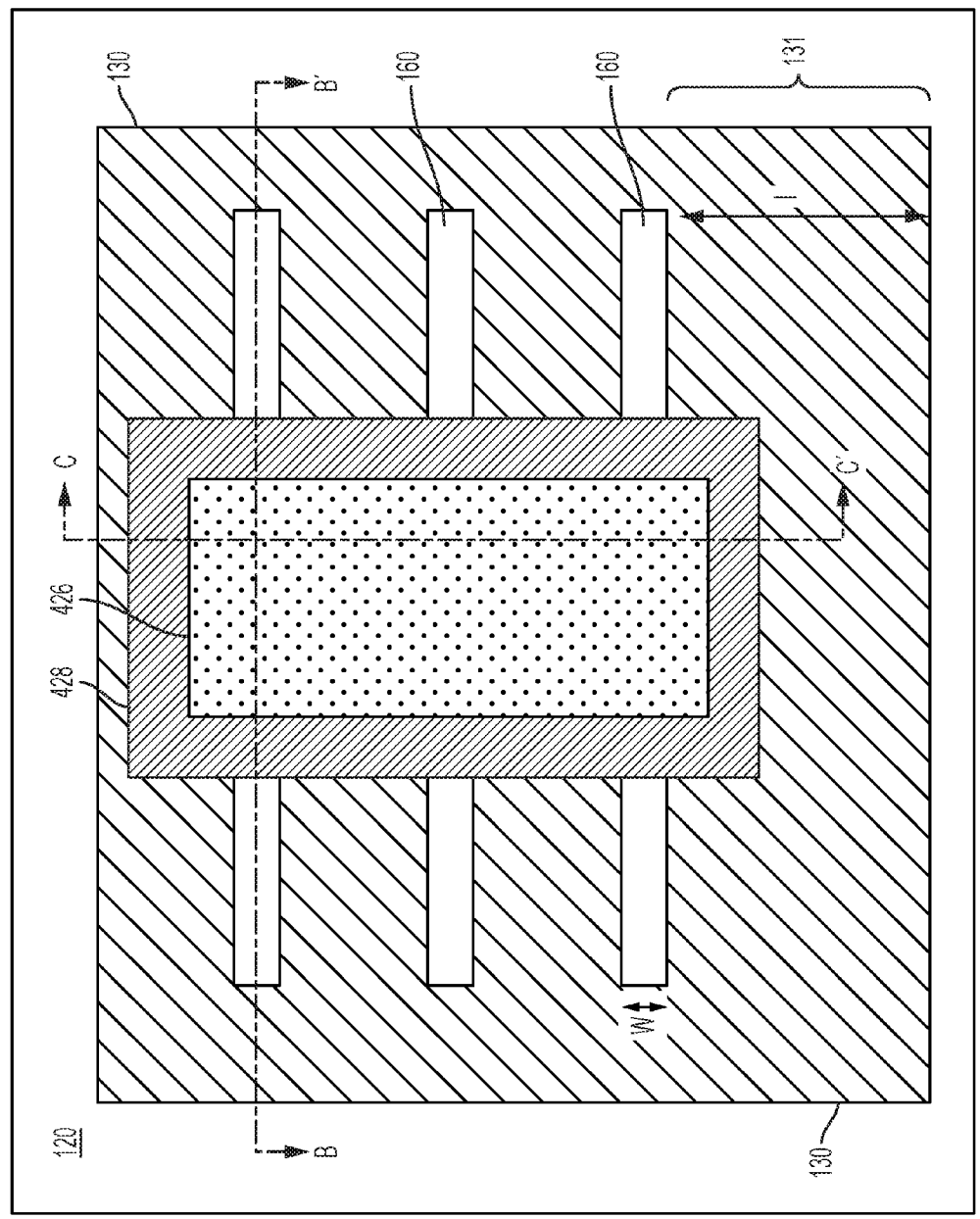
FIG. 4A is a top-down plan view of a semiconductor structure after forming a sacrificial gate structure over each of the fin stacks.

According to various embodiments, and as illustrated in FIGS. 3 and 4A, the length (l) of the portion of the semiconductor template 130 defining region 131 measured in a direction orthogonal to the length (L) of the fin stacks 300 can be at least as large as the fin-to-fin repeat distance or pitch. For example, the length (l) of the extended portion of the semiconductor template 130 can be 1, 2, 3, 4, 5, 10 or 20 times a fin-to-fin repeat distance.

Figure 4B:
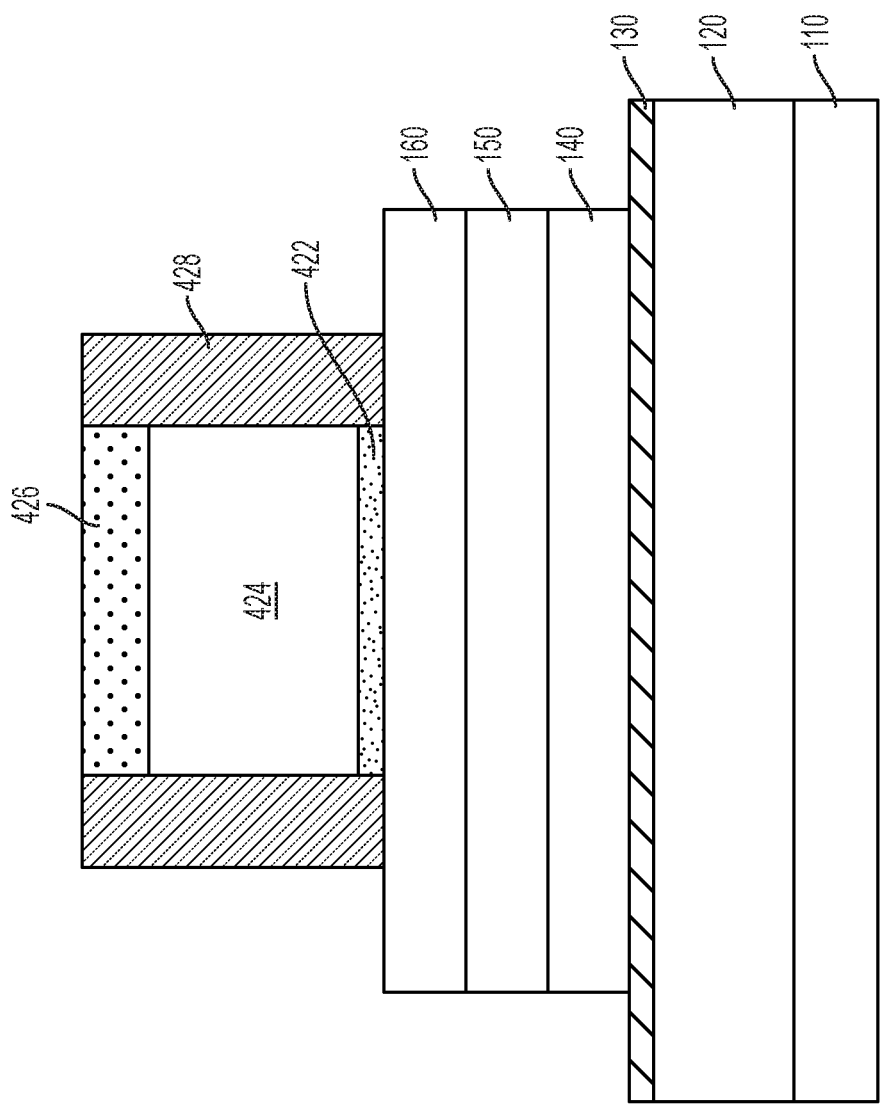
FIG. 4B is a cross-sectional view of the semiconductor structure of FIG. 4A along line B-B'.
Figure 4C:
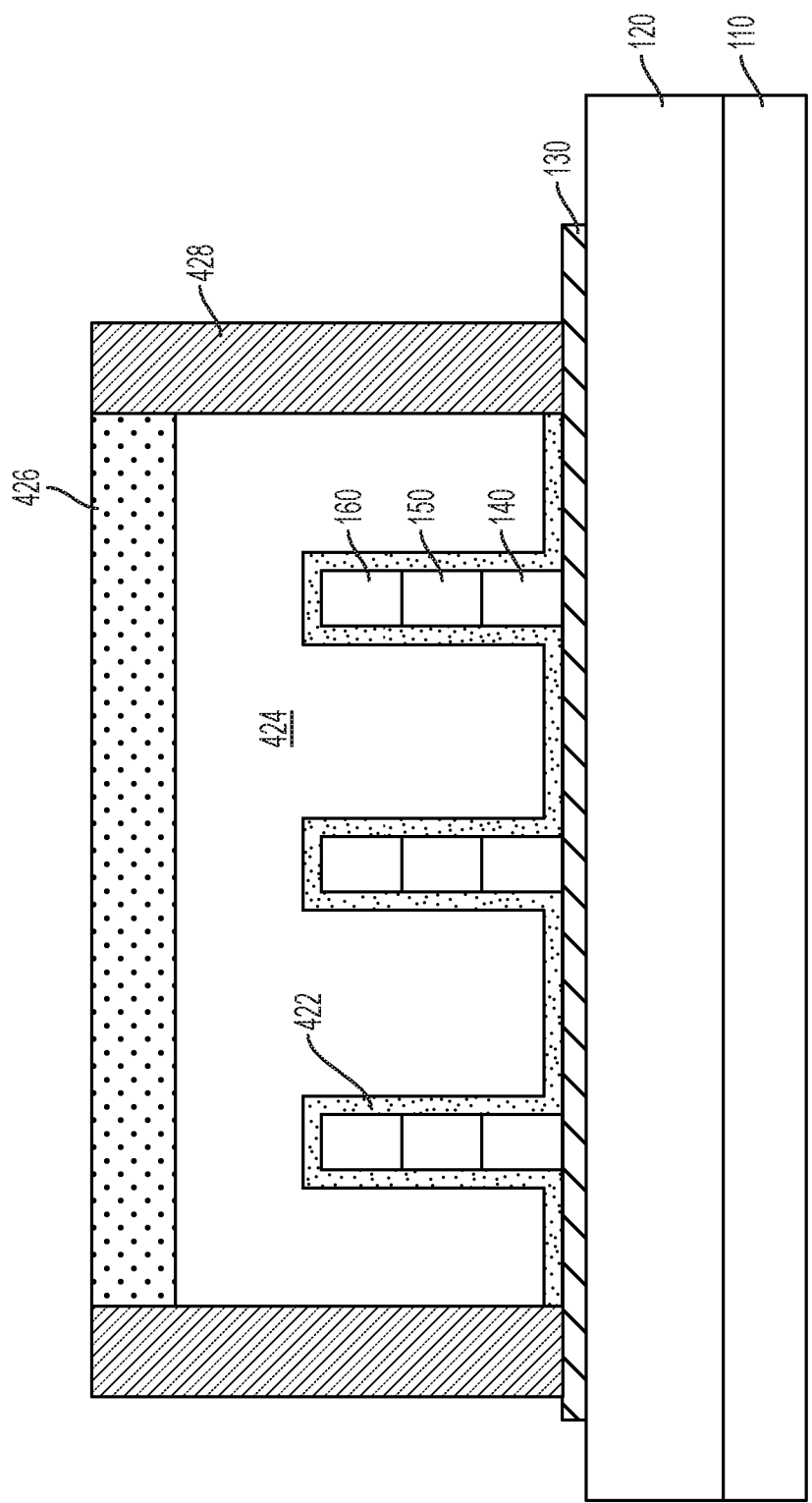
FIG. 4C is a cross-sectional view of the semiconductor structure of FIG. 4A along line C-C'.

Referring to FIGS. 4A-4C, a sacrificial gate structure is formed over a portion of each of the fin stacks (140, 150, 160). The sacrificial gate structure includes a sacrificial gate stack and a gate spacer 428 formed on each sidewall of the sacrificial gate stack. The sacrificial gate stack includes, from bottom to top, a sacrificial gate dielectric 422, a sacrificial gate conductor 424 and a sacrificial gate cap 426. In some embodiments, the sacrificial gate dielectric 422 and/or the sacrificial gate cap 426 may be omitted. The sacrificial gate stack (422, 424, 426) may be formed by first providing a gate material stack (not shown) that includes, from bottom to top, a sacrificial gate dielectric layer, a sacrificial gate conductor layer and a sacrificial gate cap layer over the fins stacks (140, 150, 160) and the semiconductor template 130. The sacrificial gate dielectric layer may also be formed by oxidation of a surface portion of each of the first semiconductor fins 140 and the second semiconductor fins 160. When present, the sacrificial gate dielectric layer 422 includes a dielectric material such as an oxide or a nitride. In one embodiment, the sacrificial gate dielectric layer may include silicon dioxide, silicon nitride, or silicon oxynitride. The sacrificial gate dielectric layer may have a thickness from 1 nm to 10 nm, although lesser and greater thicknesses can be used.

The sacrificial gate conductor 424 may include a semiconductor material such as polysilicon or a silicon-containing semiconductor alloy such as a silicon-germanium alloy. The sacrificial gate conductor 424 may be formed using chemical vapor deposition (CVD) or plasma enhanced chemical vapor deposition (PECVD). The sacrificial gate conductor 424 may have a thickness from 20 nm to 300 nm, although lesser and greater thicknesses can be used.

The sacrificial gate cap 426 may include a dielectric material such as an oxide, a nitride or an oxynitride. In one embodiment, the sacrificial gate cap 426 is comprised of silicon nitride. The sacrificial gate cap layer can be formed utilizing a conventional deposition process including, for example, CVD and PECVD. The sacrificial gate cap layer 426 may have a thickness from 10 nm to 200 nm, although lesser and greater thicknesses can be used.

The material stack can then be patterned by lithography and defined etching to form the sacrificial gate stack (422, 424, 426). In various embodiments, a photoresist layer (not shown) is applied over the topmost surface of the material stack and is lithographically patterned by lithographic exposure and development. The pattern in the photoresist layer is transferred into the material stack by an etch, which can be an anisotropic etch such as RIE. The remaining portions of the material stack after the pattern transfer constitute the sacrificial gate stack (422, 424, 426). The patterned photoresist layer may be subsequently removed by, for example, ashing.

The gate spacer 428 may include a dielectric material such as, for example, an oxide, a nitride, an oxynitride, or any combination thereof. For example, the gate spacer 428 may be composed of silicon nitride, silicon boron carbon nitride, or silicon carbon oxynitride. The gate spacer 428 can be formed by first providing a conformal gate spacer material layer (not shown) on exposed surfaces of the sacrificial gate stacks (422, 424, 426) and the semiconductor template 130 and then etching the conformal gate spacer material layer to remove horizontal portions thereof. The conformal gate spacer material layer can be provided by a deposition process including, for example, CVD, PECVD, or physical vapor deposition (PVD). The etching of the conformal gate spacer material layer may be performed by a dry etch process such as, for example, RIE. The remaining portions of the conformal gate spacer material layer constitute the gate spacer(s) 428. The width of each gate spacer 428, as measured at the base of the gate spacer 428 can be from 5 nm to 100 nm, although lesser and greater widths can be used. A cross-sectional view of the semiconductor structure of FIG. 4A along line B-B' is shown in FIG. 4B. A cross-sectional view of the semiconductor structure of FIG. 4A along line C-C' is shown in FIG. 4C.

Figure 5:
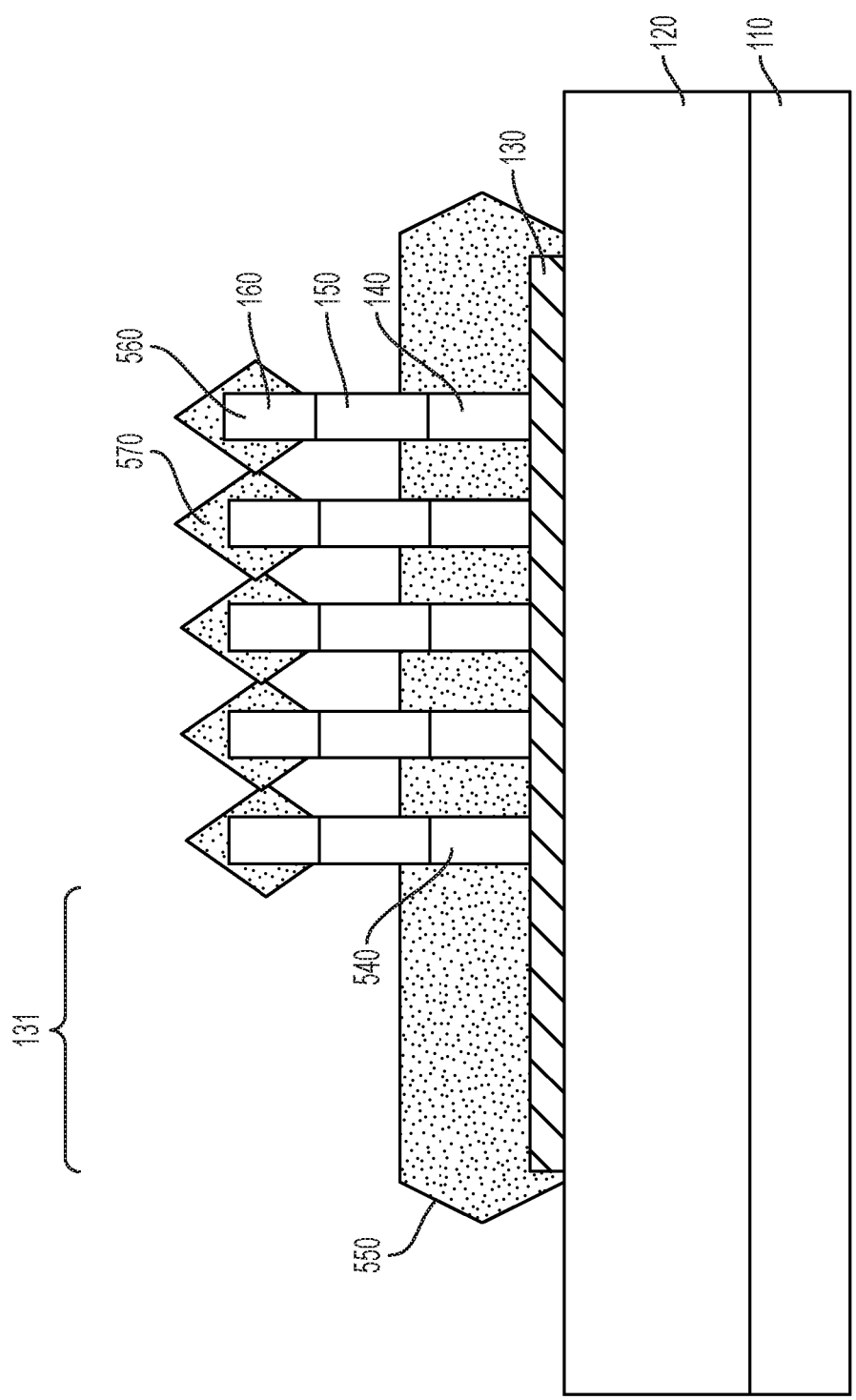
FIG. 5 shows the device architecture at an intermediate stage of fabrication after the formation and merger of raised active regions over exposed surfaces of adjacent fins within respective tiers.

Referring to FIG. 5, a first source region and a first drain region (herein collectively referred to as first source/drain regions 540) are formed in portions of each of the first semiconductor fins 140 that are not covered by the sacrificial gate stack (422, 424, 426), while a second source region and a second drain region (herein collectively referred to as second source/drain regions 560) are formed in portions of each of the second semiconductor fins 160 that are not covered by the sacrificial gate stack (422, 424, 426). The first and the second source/drain regions 540, 560 may be formed by in situ doping during epitaxial growth. Alternatively, first and second source/drain regions 540, 560 may be formed using ion implantation into the epitaxial regions.

In one embodiment where the first semiconductor fin 140 is for an n-type FinFET and the second semiconductor fin 160 is for a p-type FinFET, an n-type dopant such as phosphorous is incorporated into the first semiconductor fins 140 to provide the first source/drain regions 540, and a p-type dopant such as boron is incorporated into the second semiconductor fins 160 to provide the second source/drain regions 560. An activation anneal may be subsequently performed to activate the implanted dopants in the first and the second source/drain regions 540, 560.

The portion of each semiconductor fin 140, 160 that is not converted into a source region or a drain region constitutes a channel region. The channel regions collectively function as a channel of a field effect transistor.

Referring still to FIG. 5, raised active regions 550, 570 are formed on the source/drain regions 540, 560 of the plurality of semiconductor fins 140, 160, respectively, i.e., over opposing end portions of the fins. As used herein, a "raised active region" refers to a doped semiconductor material portion that protrudes above a topmost surface of an active region of a semiconductor device. An active region refers to a semiconductor material portion within a semiconductor device through which charge carriers flow during operation of the device. A "raised region" refers to a material portion that protrudes above a planar surface. The plurality of the raised active regions include raised source regions that are formed on a source side of the fins with respect to the gate stack 422, 424, 426, and raised drain regions that are formed on a drain side of the fins with respect to the gate stack 422, 424, 426.

According to various embodiments, raised active regions 550, 570 are formed by selective epitaxy. Raised active regions 550, which are formed over source and drain regions of the lower tier of fins 140, and raised active regions 570, which are formed over source and drain regions of the upper tier of fins 160 may be formed simultaneously. Raised active regions 550, 570 may comprise silicon (e.g., Si) or a silicon-containing material such as silicon germanium (SiGe).

Epitaxial growth on the bottom tier of fins advances from both the fin sidewalls, which have a (110) orientation in certain embodiments, as well as the top surface of the semiconductor template 130, which has a (100) orientation in certain embodiments. Thus, in various embodiments, the lower tier of raised active regions 550 have a substantially planar morphology due to dominant epitaxial growth from the (100) top surface of the semiconductor template 130. In the illustrated embodiment, a top surface of the lower tier of raised active regions 550 is substantially planar and lies above the top surface of the lower tier of fins 140.

In various embodiments, the topmost surface of the fins have a (100) orientation while the sidewalls of the fins present a (110) orientation. Epitaxial growth on the fins thus naturally forms into shaped, i.e. diamond-shaped structures. The faceted shape results from the different relative growth rates over different crystallographic orientations. The growth rate on silicon (Si) surfaces having (100) orientations is faster than that on other planes such as (110) and the growth rate on silicon surfaces having (111) orientations is slower than that on other planes such as (110) or (100) planes. Accordingly, the diamond-shaped structures formed on the upper tier of fins 160 result from the slowest epitaxial growth rate on the (111) surface.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. The epitaxial semiconductor material that is formed is single crystalline and seamless. That is, there is no apparent interface between the epitaxial semiconductor material and the underlying semiconductor material from which it is grown. In some embodiments, epitaxial growth and/or deposition processes are selective to forming on a semiconductor surface, and do not deposit material on dielectric surfaces, such as silicon dioxide or silicon nitride surfaces.

The epitaxial growth process may performed utilizing any conventional technique and conditions that are capable of forming an epitaxial semiconductor material. Example epitaxial growth processes include low energy plasma deposition (LEPD), liquid phase epitaxy (LPE), molecular beam epitaxy (MBE), reduced pressure chemical vapor deposition (RPCVD), atmospheric pressure chemical vapor deposition (APCVD), rapid thermal chemical vapor deposition (RTCVD), and ultra-high vacuum chemical vapor deposition (UHVCVD). The temperature for epitaxial deposition typically ranges from 550° C. to 900° C., though lower and higher deposition temperatures are contemplated. Higher temperatures typically result in faster deposition rates, although faster deposition rates may cause crystal defects and film cracking.

The epitaxial source and drain regions 550, 570 may be doped. Doping of the raised active regions 550, 570 may be done in situ, i.e., during epitaxial growth. Doping changes the electron and hole carrier concentrations of an intrinsic semiconductor at thermal equilibrium. A doped layer or region may be p-type or n-type. For instance, if the plurality of semiconductor fins are doped with dopants of a first conductivity type, e.g., prior to formation of the gate stack, the plurality of raised active regions can be doped with dopants of a second conductivity type, which is the opposite of the first conductivity type. If the first conductivity type is p-type, the second conductivity type is n-type, and vice versa. The dopant concentration within the source and drain regions 540, 560 may range from $2 \times 10^{20}$ atoms/cm$^3$ to $3 \times 10^{21}$ atoms/cm$^3$, e.g., $4 \times 10^{20}$ atoms/cm$^3$ to $1 \times 10^{21}$ atoms/cm$^3$.

An optional drive-in anneal can be used to diffuse dopant species and generate a desired dopant profile. In certain embodiments, dopant atoms within the source and drain raised active regions 550, 570 may be diffused into the semiconductor fins 140, 160 using a post-epitaxy anneal (e.g., at a temperature of 600° C. to 1250° C.) to create a desired dopant profile within the fins proximate to the source and drain regions.

In addition to providing an etch stop for defining the fin stacks, the semiconductor template 130 provides an epitaxial growth surface for raised source/drain regions for the lower tier of fins that extends laterally with respect to the fins. Because the semiconductor template 130 extends laterally from the fin stacks, the epitaxial raised source/drain regions 550 for the bottom tier of fins can also extend laterally from the fins, as well as from the raised source/drain regions 570 for the top tier of fins, and thus present a larger contact area from above compared to a raised source/drain region formed without the semiconductor template 130 to form contact to the bottom tier of fins 140. In various embodiments, a length of the bottom tier raised active region 550 is at least as large as the extended length (l) of the semiconductor template 130. In certain embodiments, the epitaxial raised source/drain regions for at least one of the bottom tier and the top tier of fins are merged between adjacent fins.

Figure 6:
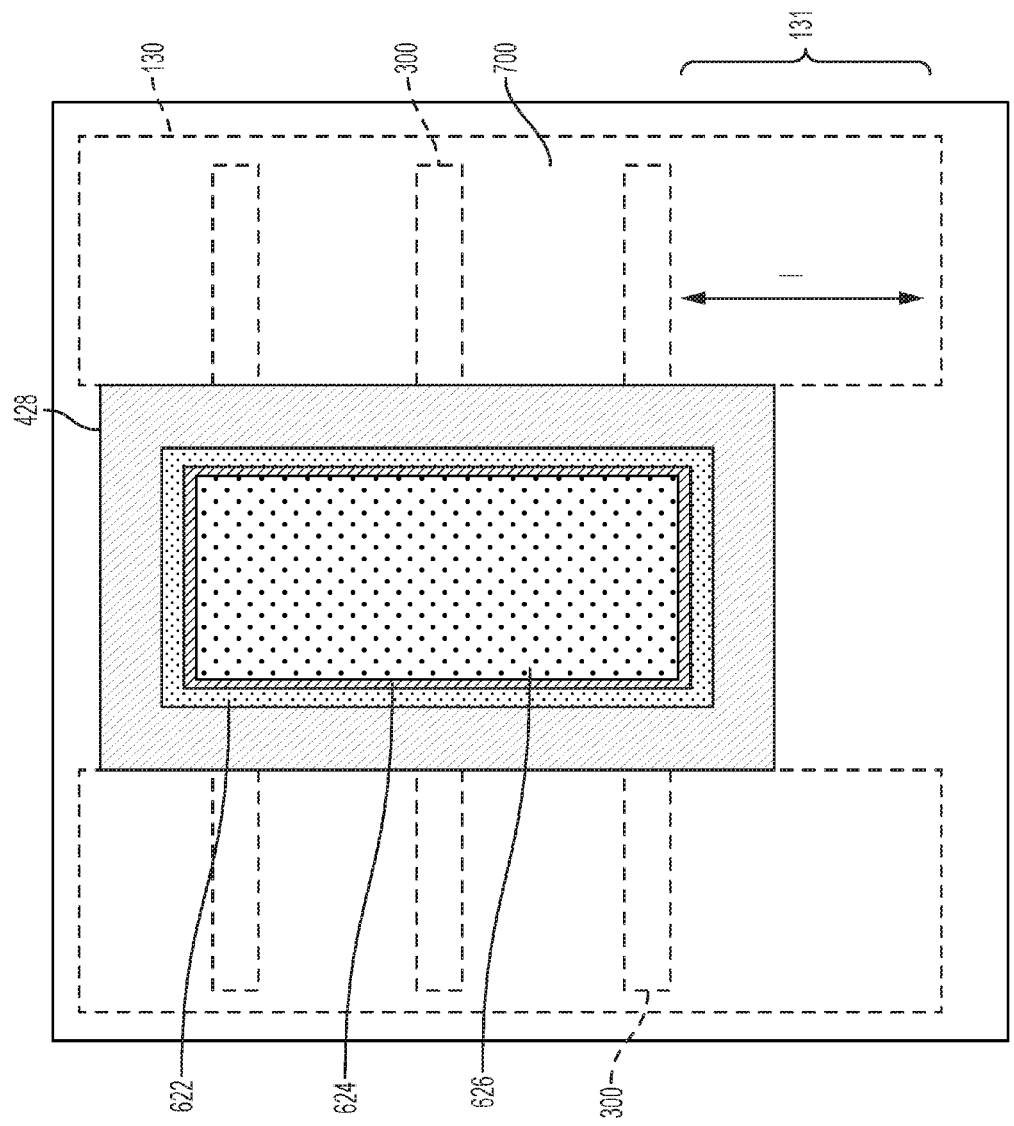
FIG. 6 is a top-down plan view of a semiconductor structure after forming an interlayer dielectric and a gate stack including a gate dielectric and a gate conductor.

Referring to FIG. 6, an interlevel dielectric (ILD) layer 700 can be formed over the semiconductor template 130, the first dielectric layer 120, and the first and the second source/drain regions 540, 560, including raised source/drain regions 550, 570 to laterally surround the sacrificial gate structure. The ILD layer 700 may include a dielectric material such as undoped silicon dioxide, doped silicon dioxide, silicon nitride, porous or non-porous organosilicate glass, porous or non-porous nitrogen-doped organosilicate glass, or a combination thereof. The ILD layer 700 may be formed by CVD, PVD or spin coating. The thickness of the ILD layer 700 may be selected so that an entirety of the top surface of the ILD layer is formed above the top surface of the sacrificial gate cap 426. The ILD layer 700 may be subsequently planarized, for example, by CMP and/or a recess etch using the sacrificial gate cap 426 as an etch stop. After the planarization, according to embodiments, the ILD layer has a topmost surface coplanar with the top surface of the sacrificial gate cap 426.

The formation of a gate dielectric and a gate electrode can be effected, for example, by deposition of a stack of a gate dielectric layer and a gate electrode layer, and by subsequent patterning of the gate cap dielectric layer, the gate electrode layer, and the gate dielectric layer. Patterning of the gate cap dielectric layer and the gate electrode layer can be performed using a combination of lithographic methods and at least one anisotropic etch. Patterning of the gate dielectric layer can be performed using an isotropic etch that is selective to the semiconductor material used to form semiconductor fins.

A replacement gate architecture can be formed by initially removing the sacrificial gate stack (422, 424, 426) to provide a gate cavity. The sacrificial gate stack (422, 424, 426) may be removed selectively to the semiconductor materials of the first and the second semiconductor fins 140, 160, the template 130, the dielectric fin 150, the gate spacers 428, and the ILD layer 700 using at least one etch. The at least one etch can be a dry etch and/or a wet chemical etch. The gate cavity occupies a volume from which the sacrificial gate stack (422, 424, 426) is removed and is laterally confined by inner sidewalls of the gate spacers 428. The gate cavity exposes the top surface of the second semiconductor fins 160, and sidewalls of the fin stack 300, including second semiconductor fins 160, dielectric fins 150 and first semiconductor fins 140.

Figure 7A:
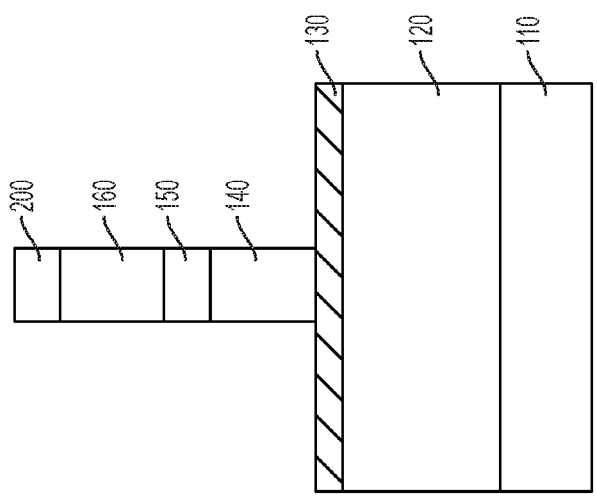
FIG. 7A is a cross-sectional view of a semiconductor structure showing a stacked fin disposed over a semiconductor template layer within a channel region.
Figure 7B:
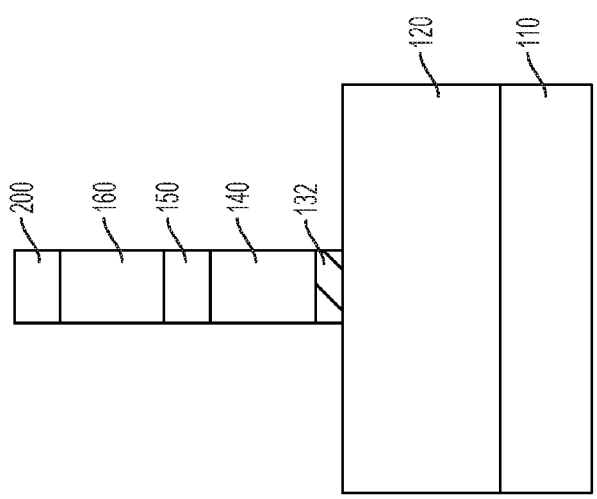
FIG. 7B shows the structure of FIG. 7A following partial removal of the semiconductor template layer.
Figure 7C:
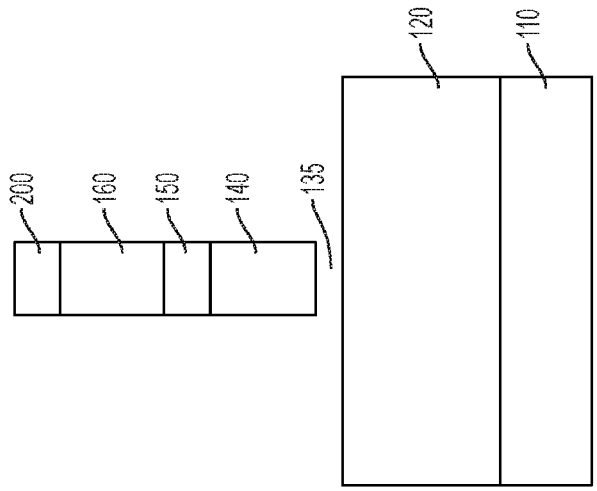
FIG. 7C shows the structure of FIG. 7A following complete removal of the semiconductor template layer.

After removing the dummy gate to form the gate cavity, an exposed fin stack within the channel region is shown schematically in FIGS. 7A-7C. FIG. 7A is a cross-sectional view showing a fin stack 140, 150, 160 disposed over semiconductor template layer 130. At this stage of processing, adjacent fin stacks are connected via template layer 130, which may create an undesirable fin-to-fin short. Using hard mask 200, an anisotropic etch can remove a portion of semiconductor template 130 within the channel region. FIG. 7B shows the structure following partial removal of the semiconductor template 130 to form a stacked fin 140, 150, 160 on a SiGe fin 132, for example, within the channel region.

Optionally, as shown in FIG. 7C, semiconductor template fin 132 can be selectively etched to create a void 135. In various embodiments, void 135 may be backfilled with a different semiconductor material. For example, void 135 may be backfilled with the same semiconductor material that forms first semiconductor fin 140.

Referring again to FIG. 6, a gate dielectric layer 622, work function metal layer 624 and gate conductor layer 626 can then be sequentially formed within the gate cavity over the fin stacks 300 and over the ILD layer.

The gate dielectric layer 622 may be formed by conformally depositing a dielectric material by CVD or atomic layer deposition (ALD) over the sidewalls and the bottom surface of the gate cavity and the topmost surface of the ILD layer 700.

Gate dielectric layer 622 may comprise silicon dioxide, silicon nitride, silicon oxynitride, a high-k dielectric, or other suitable material. As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al^2O^3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO^xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The gate dielectric thickness may range from 1 nm to 10 nm, e.g., 1, 2, 4, 6, 8 or 10 nm, including ranges between any of the foregoing.

Subsequently, a work function metal layer 624 is conformally deposited over the gate dielectric layer 622. The work function metal layer 624 may include TiAlC, TaAlC, TiAl, Ti, or Al. The work function of the work function metal layer 624 may range from 4.1 eV to 4.3 eV. The work function metal layer 624 may be formed by a suitable deposition process such as, for example, CVD, PVD or ALD. The work function metal layer 624 that is formed may have a thickness ranging from 1 nm to 10 nm, although lesser and greater thicknesses can also be employed.

A gate conductor layer 626 is then formed over the work function metal layer 624 to fill a remaining volume of the gate cavity. The gate conductor layer 626 may include any conductive material including, for example, may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor layer may be formed by a conventional deposition process such as, for example, CVD, PVD or ALD.

Portions of the gate conductor layer 626, the work function metal layer 624 and the gate dielectric layer 622 that are located above the topmost surface of the ILD layer 700 are removed using planarization process, such as, for example, CMP. Remaining portions of the gate dielectric layer disposed on the sidewalls and the bottom surface of the gate cavity constitutes a gate dielectric and a remaining portion of the work function metal layer 624 overlying the gate dielectric 622 constitutes a work function metal. A remaining portion of the gate conductor layer in the gate cavity constitutes a gate conductor. Topmost surfaces of the gate dielectric 622, the work function metal 624 and the gate conductor portion 626 may be coplanar with the topmost surface of the ILD layer 700.

The semiconductor template 130 and the source/drain regions of the fins stacks 300 are shown in phantom in FIG. 6, beneath the ILD layer 700. The raised source/drain regions have been omitted for clarity. The patterned semiconductor template 130 extends laterally in a direction orthogonal to a lengthwise direction of the fins into region 131.

Figure 8:
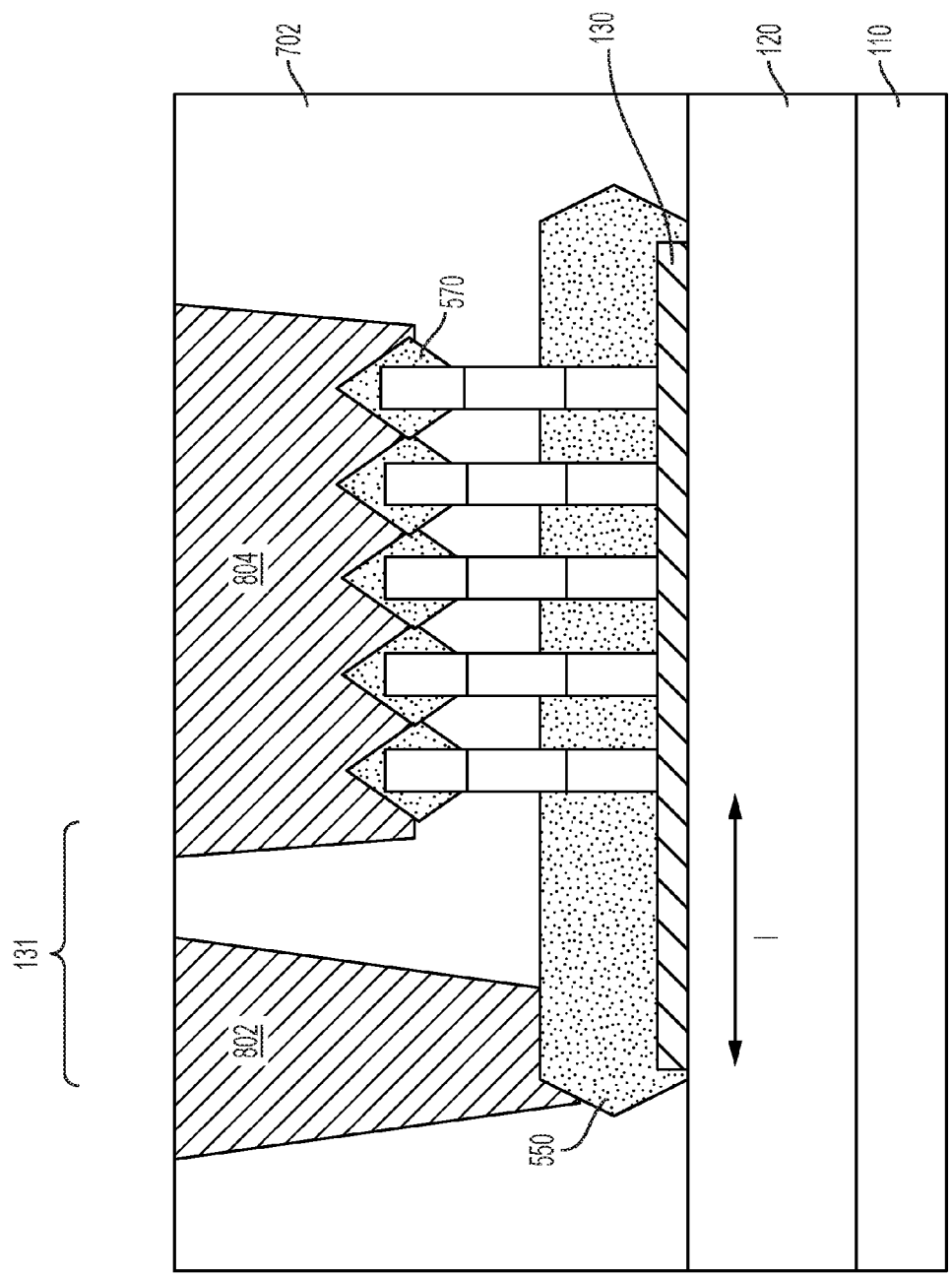
FIG. 8 shows the deposition of an interlayer dielectric over the structure of FIG. 5 and the formation of contacts through the interlayer dielectric to both the upper and lower tiers of raised active regions.

Referring to FIG. 8, various contact structures are formed. The contact structures include gate contact structures (not shown) contacting metal gate portions 624, 626, a first source/drain contact structure 802 contacting raised active region 550 (i.e., in electrical contact with first source/drain regions 540), and a second source/drain contact structure 804 contacting raised active region 570 (i.e., in electrical contact with second source/drain regions 560). Contact between first source/drain contact structure 802 and raised active region 550 is made within region 131, such that the contact is laterally offset from fin stacks 300.

First source/drain contact structure 802 may contact a planar top surface of raised active region 550 and/or a faceted surface of raised active region 550. In the illustrated embodiment, contact between the first source/drain contact structure 802 and raised active region 550 bridges the planar top surface and the faceted surface. In alternate embodiments, the first source/drain contact structure 802 contacts only a planar top surface of raised active region 550.

The contact structures 802, 804 may be formed by first depositing a contact level dielectric layer 702 over the ILD layer, the gate dielectric 622, the metal gate structure 624, 626, the gate spacer 428 and the raised active regions 550, 570. The contact level dielectric layer 702 may include a dielectric material such as, for example, silicon oxide, silicon nitride, silicon oxynitride, organosilicate glass, or a combination thereof. In some embodiments, the contact level dielectric layer 702 may include the same dielectric material as the ILD layer 700. The contact level dielectric layer 702 may be formed by CVD, PVD or spin coating. If the contact level dielectric layer 702 is not self-planarizing, the top surface of the contact level dielectric layer 702 may be planarized, for example, by CMP.

Contact openings (not shown) are formed by a combination of lithographic patterning and anisotropic etch. The contact openings include a first contact opening extending through the contact level dielectric layer 702 to expose a top surface of raised active region 550, and a second contact opening extending through the contact level dielectric layer 702 to expose a top surface of raised active region 570.

A contact material layer (not shown) is deposited in the contact openings to completely fill the contact openings. The contact material layer may include a metal such as, for example, W, Al, Cu, as well as alloys thereof. The contact material layer can be formed by any suitable deposition method such as, for example, CVD, PVD or plating. Portions of the contact material layer located above the topmost surface of the contact level dielectric layer 702 may be subsequently removed by employing a planarization process, such as, for example, CMP to provide the contact structures 802, 804.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a gate dielectric that comprises hafnium oxide include embodiments where a gate dielectric consists essentially of hafnium oxide and embodiments where a gate dielectric consists of hafnium oxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A semiconductor structure comprising:
  a fin stack disposed on a substrate, the fin stack comprising a first semiconductor fin, a dielectric fin atop the first semiconductor fin, and a second semiconductor fin atop the dielectric fin; and
  a template semiconductor layer disposed beneath the fin stack, wherein the template semiconductor layer extends laterally in a direction orthogonal to a lengthwise direction of the stacked semiconductor fins 1 to 20 times a fin-to-fin repeat distance, and a composition of the template semiconductor layer is different than a composition of the first semiconductor fin.

2. The semiconductor structure of claim 1, wherein the template semiconductor layer comprises silicon germanium and the first semiconductor fin comprises silicon.

3. The semiconductor structure of claim 1, wherein the first semiconductor fin comprises silicon and the second semiconductor fin comprises silicon germanium.

4. The semiconductor structure of claim 1, wherein the template semiconductor layer extends laterally in a direction orthogonal to a lengthwise direction of the fin stack.

5. The semiconductor structure of claim 1, wherein the template semiconductor layer extends 20 to 2000 nm laterally in a direction orthogonal to a lengthwise direction of the fin stack.

6. The semiconductor structure of claim 1, further comprising a gate stack straddling a portion of the fin stack, the gate stack comprising a gate dielectric contacting a channel portion of the first semiconductor fin, the dielectric fin and a channel portion of the second semiconductor fin, a work function metal overlying the gate dielectric, and a gate conductor overlying the work function metal.

7. The semiconductor structure of claim 6, further comprising first raised active regions disposed over portions of the first semiconductor fin on opposite sides of the gate stack, and second raised active regions disposed over portions of the second semiconductor fin on opposite sides of the gate stack, wherein the first raised active regions extend laterally over the template semiconductor layer.

8. The semiconductor structure of claim 7, further comprising a contact level dielectric layer disposed over the first and second raised active regions, first contact structures extending through the contact level dielectric and contacting respective ones of the first raised active regions, and second contact structures extending through the contact level dielectric and contacting respective ones of the second raised active regions.

9. The semiconductor structure of claim 8, wherein the first contact structures contact planar top surfaces of the first raised active regions.

10. A method of forming a semiconductor structure comprising:
  forming a template semiconductor layer on a substrate; and
  etching a second semiconductor layer, a dielectric layer and a first semiconductor layer selectively with respect to the template semiconductor layer to form a plurality of stacked semiconductor fins on the template semiconductor layer, the stacked semiconductor fins comprising a first semiconductor fin atop the template semiconductor layer, a dielectric fin atop the first semiconductor fin, and a second semiconductor fin atop the dielectric fin;
  wherein a composition of the template semiconductor layer is different than a composition of the first semiconductor fin.

11. The method of claim 10, further comprising removing a portion of the template semiconductor layer such that a remaining portion of the template semiconductor layer extends laterally in a direction orthogonal to a lengthwise direction of the stacked semiconductor fins.

12. The method of claim 10, further comprising removing a portion of the template semiconductor layer such that a remaining portion of the template semiconductor layer extends laterally in a direction orthogonal to a lengthwise direction of the stacked semiconductor fins 1 to 20 times a fin-to-fin repeat distance.

13. The method of claim 10, further comprising forming a first raised active regions over a portions of the first semiconductor fins, and a second raised active regions over a portions of the second semiconductor fins, wherein the first raised active regions extends laterally over the template semiconductor layer.

14. The method of claim 13, further comprising:
  forming a contact level dielectric layer over the first and second raised active regions;
  forming a first contact structures extending through the contact level dielectric and contacting the first raised active regions; and
  forming a second contact structures extending through the contact level dielectric and contacting the second raised active region.

15. The method of claim 14, wherein the first contact structures contacts a planar top surfaces of the first raised active regions.

16. The method of claim 10, wherein the template semiconductor layer comprises silicon germanium, the first semiconductor fin comprises silicon, and the second semiconductor fin comprises silicon.

17. A method of forming a semiconductor structure comprising:
  forming a template semiconductor layer on a substrate;
  forming a plurality of stacked semiconductor fins on the template semiconductor layer, the stacked semiconductor fins comprising a first semiconductor fin atop the template semiconductor layer, a dielectric fin atop the first semiconductor fin, and a second semiconductor fin atop the dielectric fin; and
  removing a portion of the template semiconductor layer such that a remaining portion of the template semiconductor layer extends laterally in a direction orthogonal to a lengthwise direction of the stacked semiconductor fins 1 to 20 times a fin-to-fin repeat distance,
  wherein a composition of the template semiconductor layer is different than a composition of the first semiconductor fin.

* * * * *